(12) United States Patent
Miller et al.

(10) Patent No.: US 7,635,874 B2
(45) Date of Patent: Dec. 22, 2009

(54) EDGE-EMITTING LED ASSEMBLY

(75) Inventors: Jeffrey N. Miller, Los Altos Hills, CA (US); Steven D. Lester, Palo Alto, CA (US); Virginia M. Robbins, Los Gatos, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 106 days.

(21) Appl. No.: 11/235,592

(22) Filed: Sep. 26, 2005

(65) Prior Publication Data

US 2007/0069228 A1    Mar. 29, 2007

(51) Int. Cl.
*H01L 27/15* (2006.01)
*H01L 29/22* (2006.01)

(52) U.S. Cl. ............... 257/98; 257/79; 257/99; 257/E33.072

(58) Field of Classification Search ............ 257/79, 257/81, 98–100, E33.072
See application file for complete search history.

(56) References Cited

U.S. PATENT DOCUMENTS

| | | | |
|---|---|---|---|
| 6,239,901 B1* | 5/2001 | Kaneko | 359/326 |
| 7,230,276 B2* | 6/2007 | Song et al. | 257/79 |
| 2004/0076213 A1* | 4/2004 | Ledentsov et al. | 372/97 |
| 2004/0180460 A1* | 9/2004 | Chirovsky et al. | 438/39 |
| 2005/0017250 A1* | 1/2005 | Nitta et al. | 257/79 |
| 2005/0173694 A1* | 8/2005 | Mawst et al. | 257/14 |
| 2007/0029555 A1* | 2/2007 | Lester et al. | 257/79 |

OTHER PUBLICATIONS

Michael Ettenberg, et al. "Very High Radiance Edge-Emitting LED" IEEE Journal of Quantum Eelctronics, vol. QE-12, No. 6, Jun. 1976.

* cited by examiner

*Primary Examiner*—Kenneth A Parker
*Assistant Examiner*—Joseph Nguyen (57) ABSTRACT

A light-emitting diode (LED) in accordance with the invention includes an edge-emitting LED stack having an external emitting surface from which light is emitted, and a reflective element that is located adjacent to at least one external surface of the LED stack other than the external emitting surface. The reflective element receives light that is generated inside the LED stack and reflects the received light back into the LED stack. At least a portion of the reflected light is then emitted from the external emitting surface.

15 Claims, 9 Drawing Sheets

EDGE-EMITTING LED ASSEMBLY

DESCRIPTION OF THE RELATED ART

Light-emitting diodes (LEDs) may be broadly classified under two categories: front-emitting LEDs and edge-emitting LEDs. While some of these LEDs are used as wide-angle illumination sources, others are used for producing directional light that is coupled into an optical fiber for example. In LEDs that produce directional light, the amount of emitted light can be increased in two ways: 1) by increasing the overall light efficiency of the LED and 2) by making the emitted light more directional.

An edge-emitting LED is typically constructed to incorporate both these solutions for increasing the amount of emitted light. The active junction region, which is the source of incoherent light in the edge-emitting LED, is sandwiched between cladding layers. The refractive index of the cladding layers is lower than the refractive index of the active junction region but higher than the refractive index of the material immediately surrounding the cladding layers. Such a structure operates as an asymmetric, dielectric waveguide to channel light towards the edge of the edge-emitting LED. Attention is drawn to the following manuscript, which provides one example of such an approach: "Very High Radiance Edge-Emitting LED," by Michael Ettenberg et al. published in the IEEE Journal of Quantum Electronics, Vol. QE-12, No. 6, Jun. 1976.

Unfortunately, this dielectric waveguide structure is not ideal, because the cladding layers and the other surrounding layers do not completely confine the light in the active junction region of the edge-emitting LED. A portion of light is lost due to radiation through these layers and out of the various external surfaces other than the external emitting surface from which light is designed to be emitted out of the edge-emitting LED.

SUMMARY

A light-emitting diode (LED) in accordance with the invention includes an edge-emitting LED stack having an external emitting surface from which light is emitted, and a reflective element that is located adjacent to at least one external surface of the LED stack other than the external emitting surface. The reflective element receives light that is generated inside the LED stack and reflects the received light back into the LED stack. At least a portion of the reflected light is then emitted from the external emitting surface.

Clearly, some alternative embodiments may exhibit advantages and features in addition to, or in lieu of, those mentioned above. It is intended that all such alternative embodiments be included within the scope of the present invention, and be protected by the accompanying claims.

BRIEF DESCRIPTION OF THE DRAWINGS

Many aspects of the invention can be better understood with reference to the following drawings. The components in the drawings are not necessarily to scale. Instead, emphasis is placed upon clearly illustrating the principles of the invention. Moreover, in the drawings, like reference numerals designate corresponding parts throughout the several views.

DETAILED DESCRIPTION

An exemplary embodiment in accordance with the invention describes an edge-emitting light-emitting diode (LED) incorporating one or more reflective elements that are located adjacent to one or more external surfaces of the LED stack other than the external emitting surface from which light is designed to be emitted. As a result of this reflection, at least a portion of the reflected light is additionally emitted from the external emitting surface thereby increasing the efficiency of the edge-emitting LED.

Figure 1:
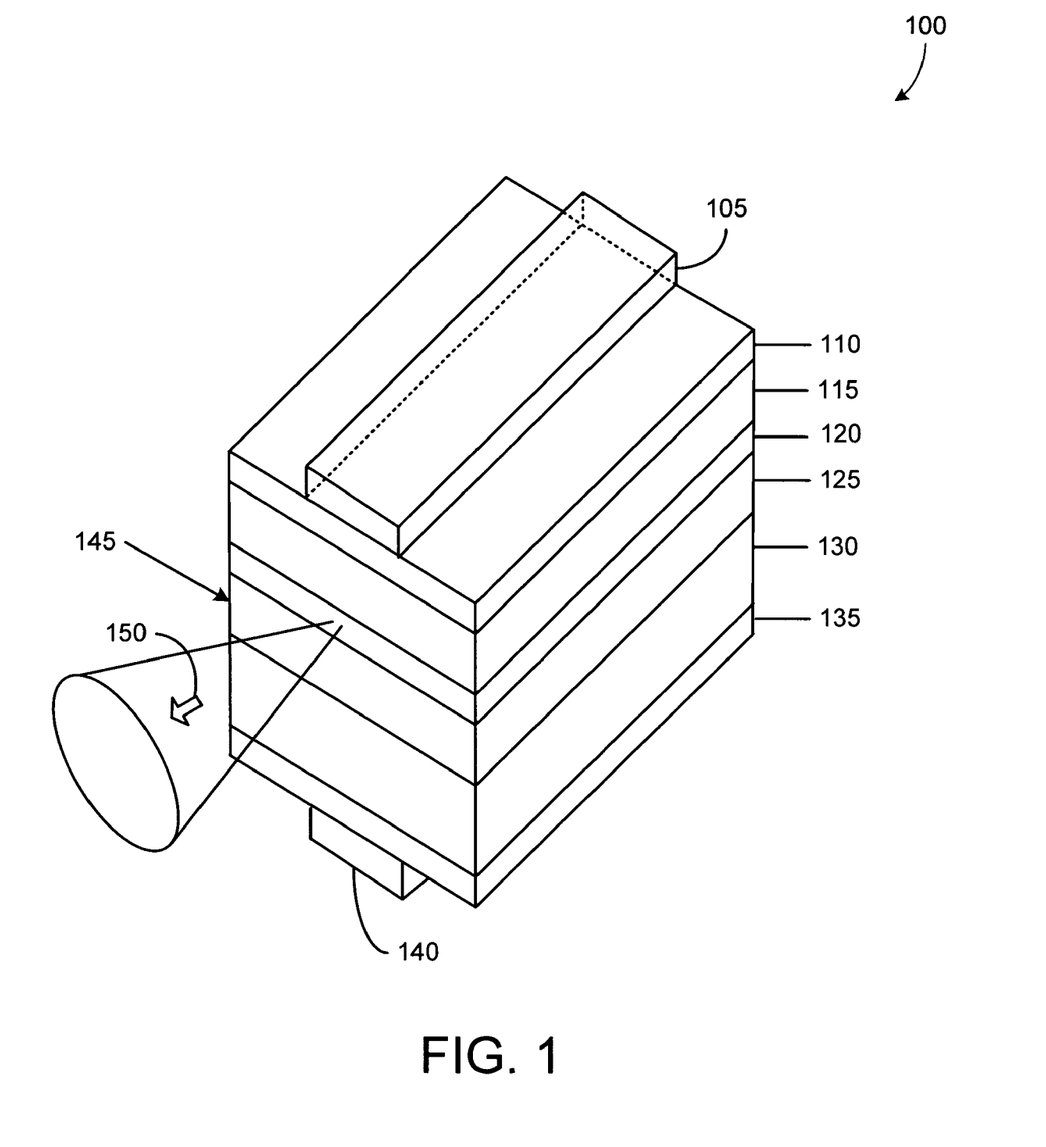
FIG. 1 shows various layers of a first exemplary edge-emitting LED stack in accordance with the invention.

FIG. 1 shows various layers of a first exemplary edge-emitting LED stack 100 in accordance with the invention. LED stack 100 is formed of multiple layers that operate to generate and transmit incoherent light. The incoherent light is generated in active region layer 120 where holes and electrons combine to emit photons. Active region layer 120 is sandwiched between a first cladding layer 115 and a second cladding layer 125. A p-type contact layer 110 is formed on a major surface of cladding layer 115, with a p-type contact 105 located on at least a portion of the major external surface of contact layer 110.

Substrate 130 is located adjacent to cladding layer 125. Typically, substrate 130 is composed of a conductive semiconductor such as GaN. An n-type contact layer 135 is formed on a major surface of substrate 130 with an n-type contact 140 located on at least a portion of the major external surface of contact layer 135.

The refractive index of cladding layer 115 is lower than the refractive index of the active region layer 120 but higher than the refractive index of the p-type contact layer 110. Similarly, the refractive index of cladding layer 125 is lower than the refractive index of the active region layer 120, but higher than the refractive index of the substrate 130 and the n-type contact layer 135.

Active region layer 120 in conjunction with the cladding layers and other layers of LED stack 100 operates as a dielectric waveguide to channel light towards an emitting edge located on external emitting surface 145 of LED stack 100. LED light is generated in the active region layer 120 when a suitable voltage is applied between p-type contact 105 and n-type contact 140.

The direction of emitted incoherent light is indicated by arrow 150. External emitting surface 145 has an anti-reflective coating, while the external surface opposing external emitting surface 145 has a reflective coating. The reflective coating operates to reflect light generated in active region layer 120 towards external emitting surface 145. Consequently, light is inhibited from escaping out the external surface opposing external emitting surface 145.

Figure 2:
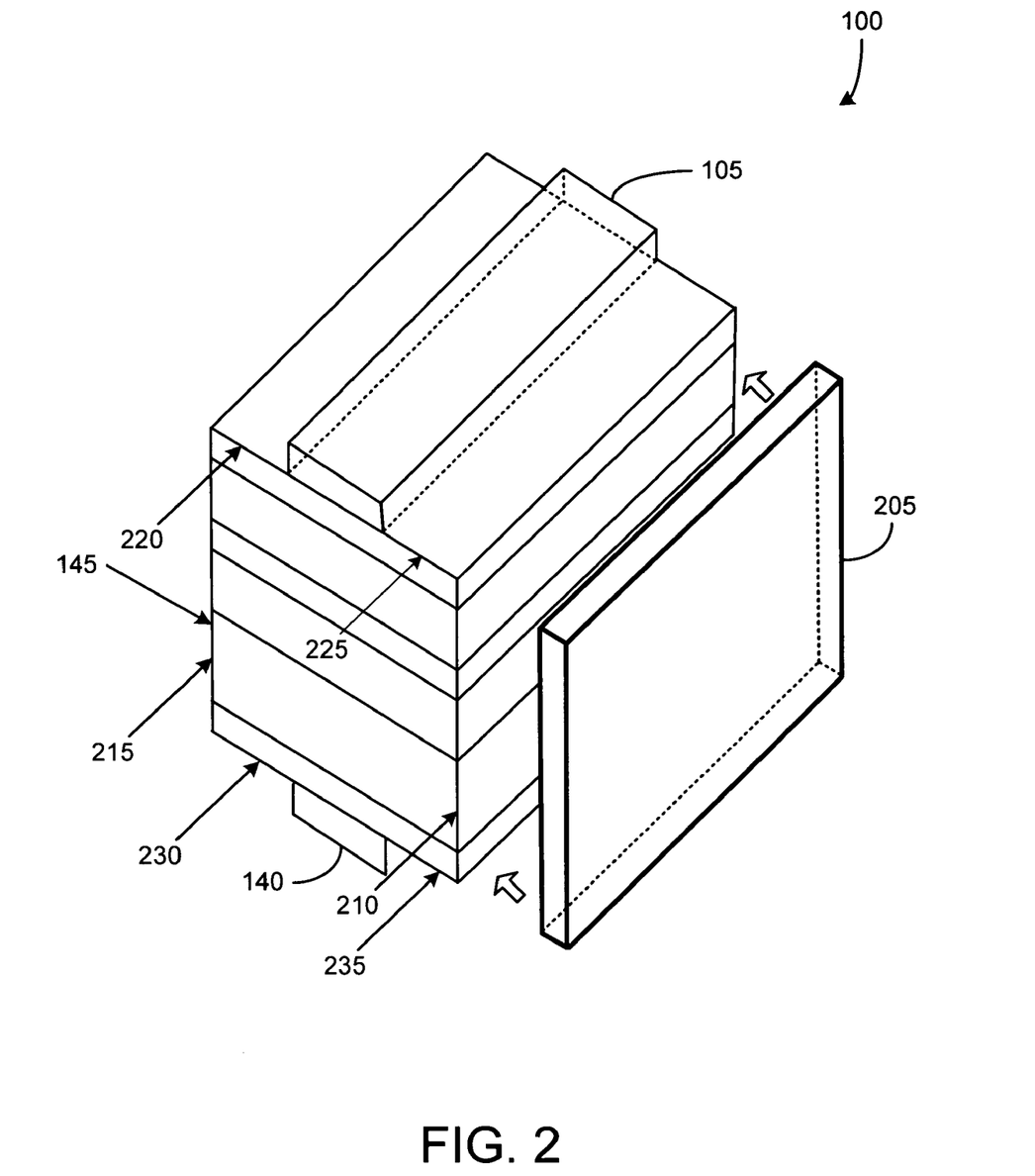
FIG. 2 shows the LED stack of FIG. 1 together with a reflective element located adjacent to an external surface other than the external emitting surface from which light is emitted.

FIG. 2 shows LED stack 100 of FIG. 1 together with an exemplary reflective element 205 located adjacent to external surface 210 of LED stack 100. Reflective element 205 is described below in more detail using FIGS. 3 and 4. In a first exemplary embodiment, reflective element 205 is attached to external surface 210 using an adhesive, such as an optical quality epoxy. In a second exemplary embodiment, reflective element 205 is located adjacent to external surface 210 using mechanical fasteners. In a third exemplary embodiment, reflective element 205 is placed adjacent to external surface 210 and LED stack 100 is encapsulated together with reflective element 205 using a suitable material such as plastic or epoxy.

Reflective element 205 reflects light generated in active region layer 120 and emitted from external surface 210 back towards the interior of LED stack 100. Reflective element 205 also reflects light emanating out of external surface 210 from other layers of LED stack 100 in addition to active region layer 120. For example, light emitted from external surface 210 associated with cladding layers 115 and 125, substrate 130, and conducting layers 110 and 135 is reflected back towards the interior of LED stack 100.

In alternative embodiments, one or more reflective elements are located adjacent to one or more external surfaces excluding external emitting surface 145 of LED stack 100. These external surfaces include external surface 215, external surface 220, external surface 225, external surface 230, and external surface 235. Typically, reflecting elements are not located adjacent to the two contacts—n-type contact 140 and p-type contact 105, which are made of metal such as gold.

Figure 3:
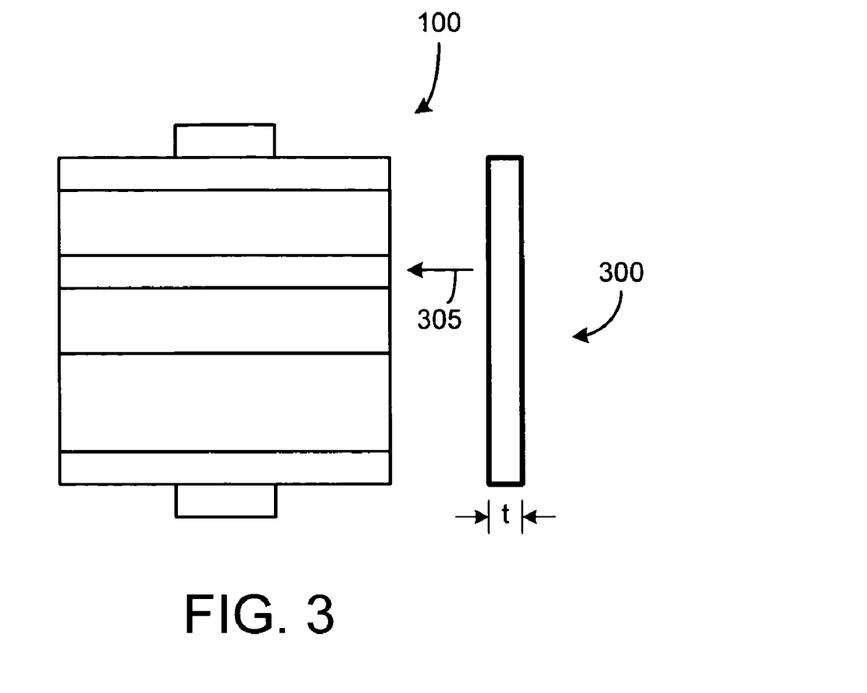
FIG. 3 shows a first exemplary embodiment of a reflective element.

FIG. 3 shows a first exemplary embodiment of a reflective element 300 that is located adjacent to an external surface of LED stack 100 other than the external emitting surface from which light is emitted. In this exemplary embodiment, reflective element 300 is a low-loss mirror which reflects light back into LED stack 100 in a direction indicated by arrow 305. Reflective element 300 is composed of material that has a refractive index lower than the refractive index of the material contained in the various layers of LED stack 100 and has a quarter-wavelength thickness "t" that is derived from a selected wavelength in a spectrum of light emitted by LED stack 100.

For example, when LED stack 100 is designed for producing red light, the quarter wavelength thickness "t" is derived from a wavelength in the center of the red visible spectrum. Similarly, when LED stack 100 is designed for producing blue light, the quarter wavelength thickness "t" is derived from a wavelength in the center of the blue visible spectrum. In alternative embodiments, visible, near-visible, and infrared wavelengths are used for determining the deriving the thickness "t" of reflective element 300. In another alternative embodiment, the refractive index of the material contained in reflective element 300 varies linearly or non-linearly from one major surface to an opposing major surface.

Figure 4:
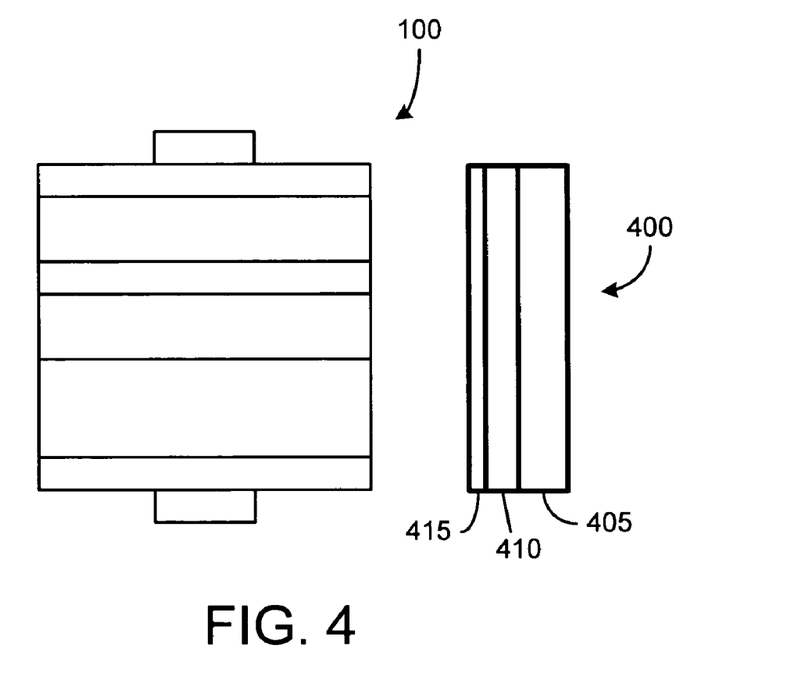
FIG. 4 shows a second exemplary embodiment of a reflective element.

FIG. 4 shows a second exemplary embodiment of a reflective element 400 that is located adjacent to an external surface of LED stack 100 other than the external emitting surface from which light is emitted. In this exemplary embodiment, reflective element 400 is composed of multiple layers of material each having a different thickness. Each of the multiple layers has a refractive index lower than the refractive index of material contained in the various layers of LED stack 100. The thickness of each of the multiple layers bears a quarter-wave relationship to one or more wavelengths of light emitted by LED stack 100.

For example, when LED stack 100 is designed for producing red light, the thickness of layer 405 is derived by using a wavelength in the low-end of the red visible spectrum. The thickness of layer 410 is derived by using a wavelength in the middle of the red visible spectrum, and the thickness of layer 415 is derived by using a wavelength in the upper-end of the red visible spectrum.

As a further example, when LED stack 100 is designed for producing blue light, the thickness of layer 405 is derived by using a wavelength in the low-end of the blue visible spectrum. The thickness of layer 410 is derived by using a wavelength in the middle of the blue visible spectrum, and the thickness of layer 415 is derived by using a wavelength in the upper-end of the blue visible spectrum.

It will be understood that FIG. 4 merely shows one exemplary arrangement of the multiple layers of reflective element 400. Other arrangements are used in other alternative embodiments. For example, in a first alternative embodiment, the thickness of each of the layers is identical to one another. In a second alternative embodiment, the thickness of each of the multiple layers decreases with location farther away from the LED stack 100. In a third alternative embodiment, the thickness of each of the multiple layers bears a linear relationship to the thickness of other layers. In a fourth alternative embodiment, the thickness of each of the multiple layers bears a non-linear relationship to the thickness of other layers—for example, a logarithmic relationship. In a fifth alternative embodiment, the refractive index of one or more of the layers is different than the refractive index of one or more of the other layers. In a sixth alternative embodiment, the refractive index of the material in one or more of the layers varies linearly or non-linearly from one major surface to an opposing major surface of the layer.

Figure 5:
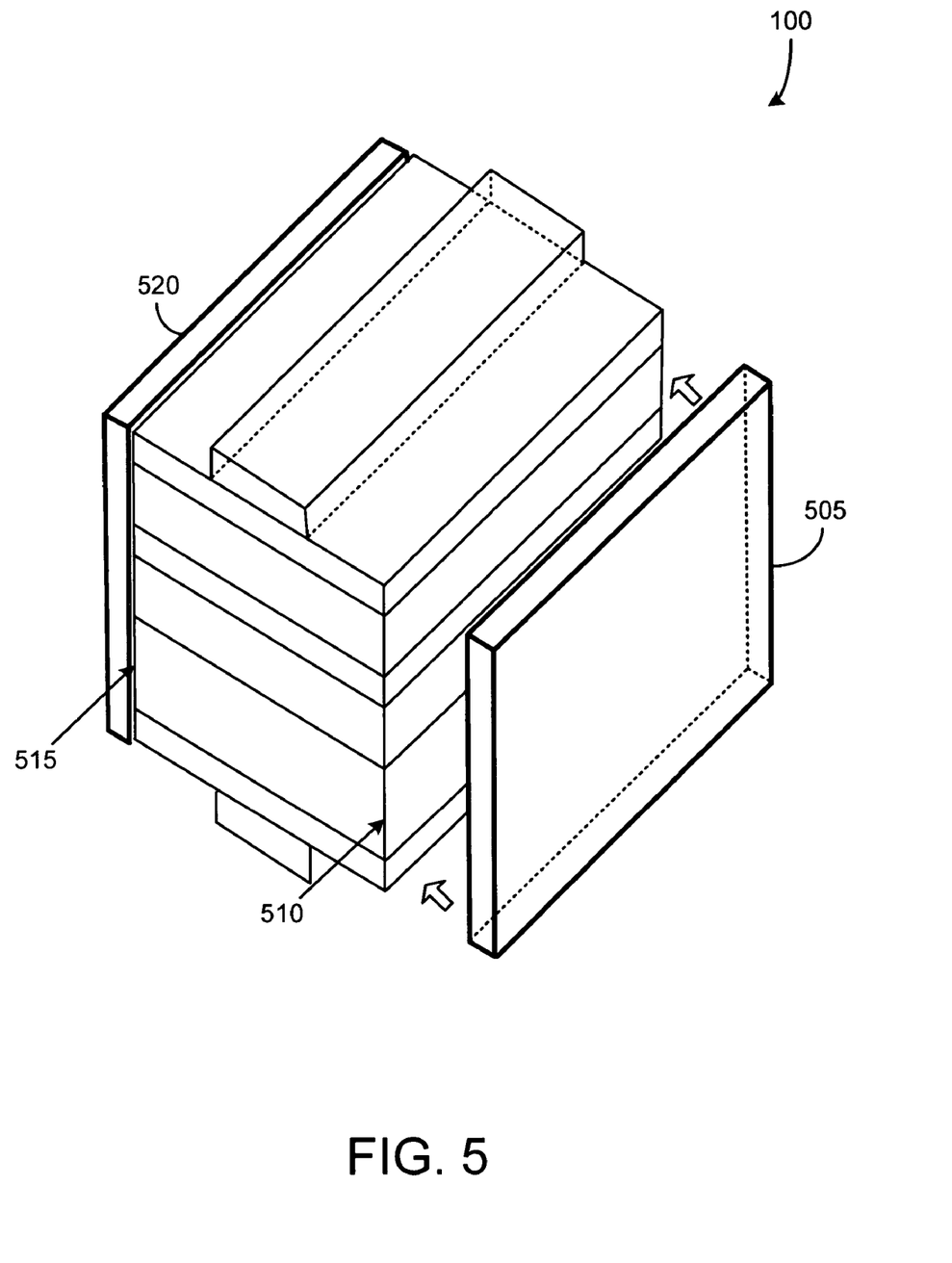
FIG. 5 shows the LED stack of FIG. 1 together with two reflective elements in accordance with the invention.

FIG. 5 shows LED stack 100 together with two exemplary reflective elements 505 and 510 located adjacent to external surfaces other than the emitting surface, in accordance with the invention. Reflective element 505 is located adjacent to external surface 510 and reflective element 520 is located adjacent to external surface 515. In a first embodiment, reflective element 505 is similar to reflective element 520. For example, the refractive index and the thickness of both reflectors are identical. In a second embodiment, reflective element 505 is different from reflective element 520. For example, reflective element 505 has a thickness that is derived from a certain wavelength of light emitted from LED stack 100, while reflective element 520 has a different thickness that is derived from a different wavelength of light emitted from LED stack 100.

Figure 6:
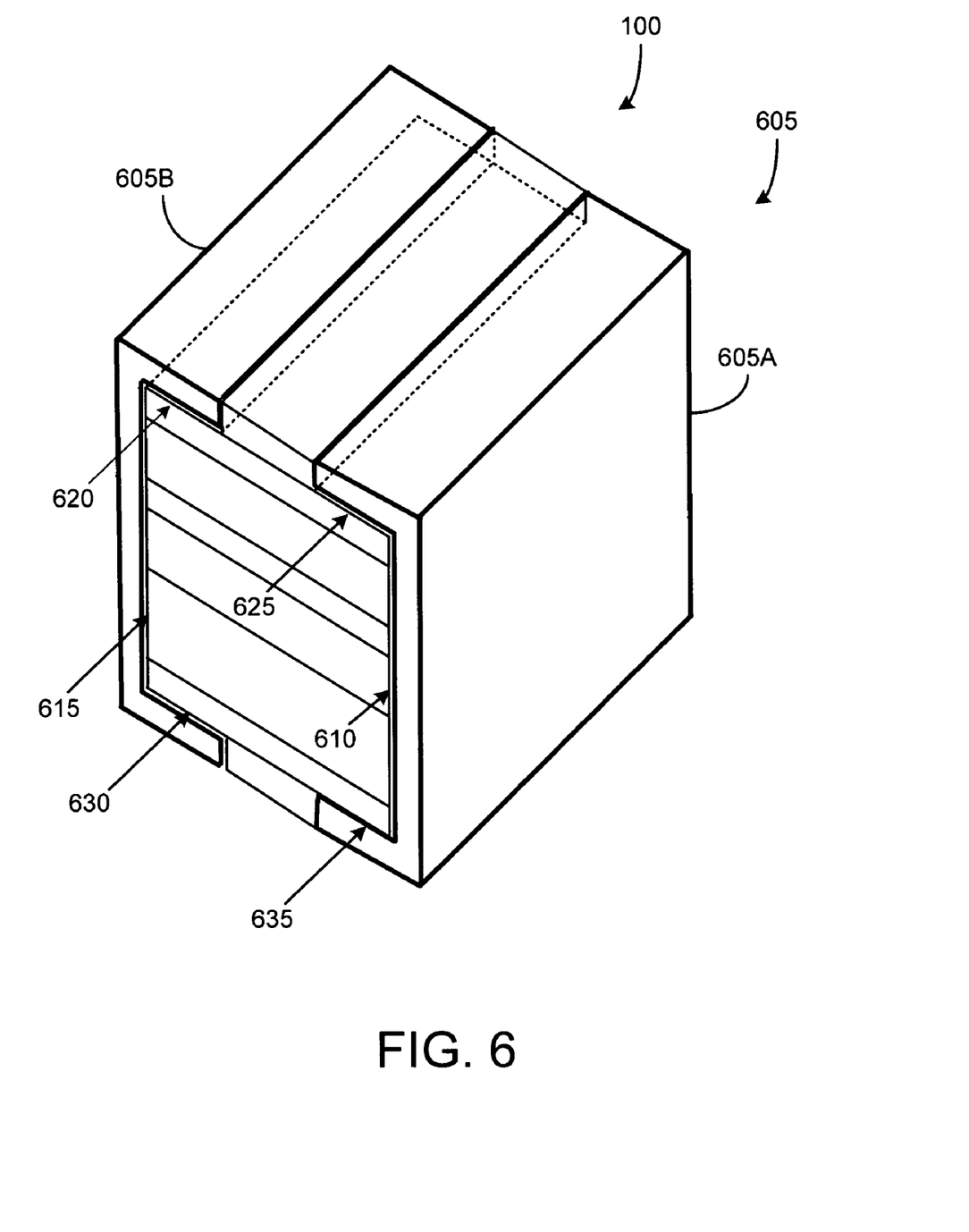
FIG. 6 shows the LED stack of FIG. 1 enclosed in a reflective enclosure in accordance with the invention.

FIG. 6 shows LED stack 100 enclosed in a reflective enclosure 605 in accordance with the invention. In this exemplary embodiment, reflective enclosure 605 is formed of two sections—reflective section 605A and reflective section 605B. Reflective section 605A is located adjacent to external surfaces 625, 610, and 635, while reflective section 605B is located adjacent to external surfaces 620, 615, and 630.

In a first exemplary embodiment, each of the reflective sections 605A and 605B is attached to the respective sides of LED stack 100 using an adhesive such as an optical quality epoxy. In a second exemplary embodiment, each of the reflective sections 605A and 605B are attached to LED stack 100 using mechanical fasteners. In a third exemplary embodiment, each of the reflective sections 605A and 605B are placed in contact with LED stack 100, and LED stack 100 is encapsulated together with the two reflective sections 605A and 605B, using a suitable material such as plastic or epoxy.

Figure 7:
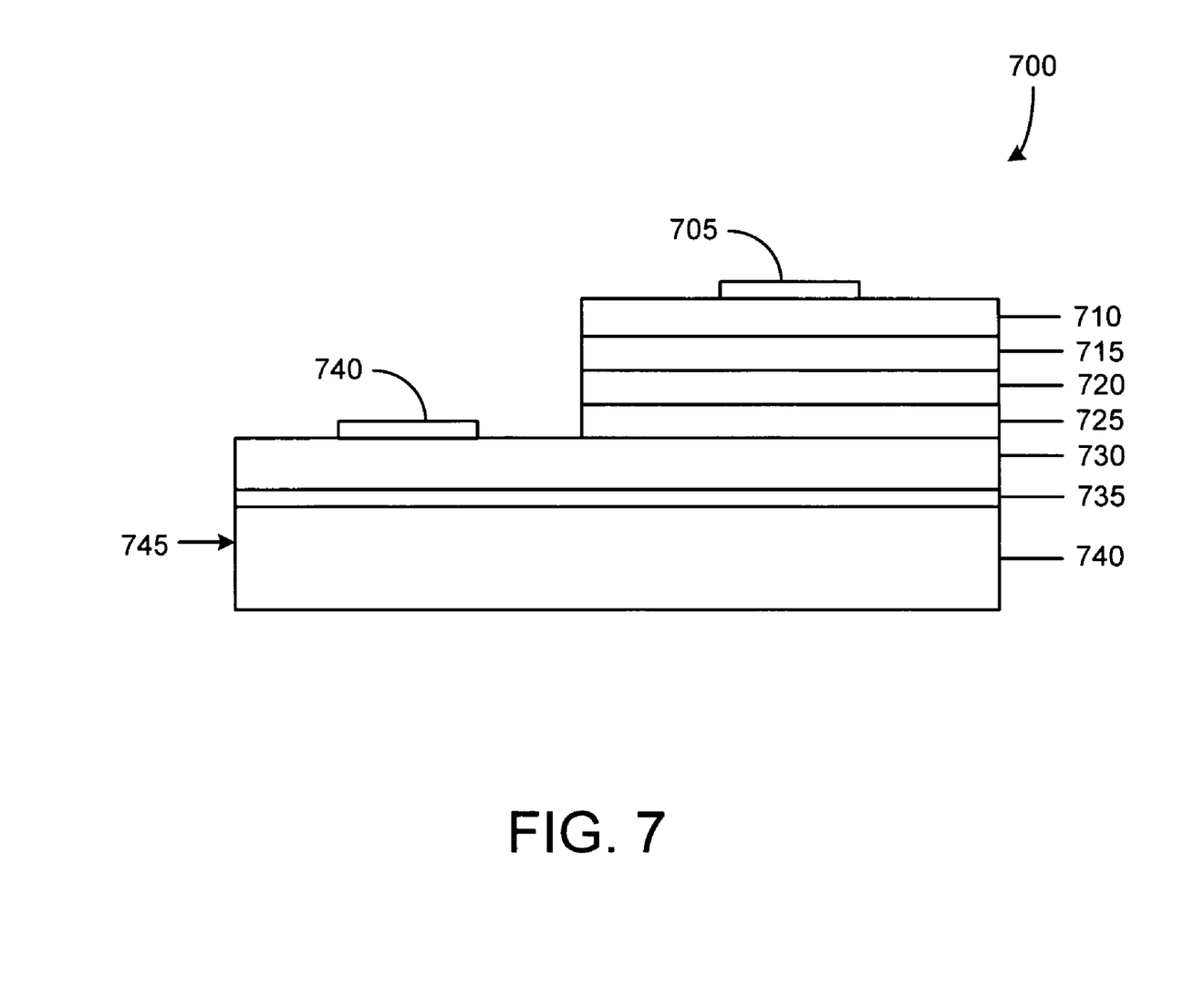
FIG. 7 shows various layers of a second exemplary edge-emitting LED stack in accordance with the invention.

FIG. 7 shows various layers of a second exemplary edge-emitting LED stack 700 in accordance with the invention. It will be understood that terms such as "top," "bottom," and "beside" are used below merely for purposes of description and are not intended to limit the positional relationship of the various elements of FIG. 7.

LED stack 700 is formed of multiple layers that operate to generate and transmit incoherent light. The incoherent light is generated in active region layer 720 where holes and electrons combine to emit photons. Active region layer 720 is sandwiched between a first cladding layer 715 and a second cladding layer 725. A p-type contact layer 710 is formed on a major surface of cladding layer 715, with a p-type contact 705 located on at least a portion of the major external surface of contact layer 710.

An n-type contact layer 730 is located below cladding layer 725, with a buffer layer 705 located below contact layer 730. An n-type contact 740 is located on at least a portion of the major external surface of contact layer 730. Substrate 740 is located below buffer layer 735. In this embodiment, substrate 740 is composed of a non-conductive material such as sapphire.

The refractive index of cladding layer 715 is lower than the refractive index of the active region layer 720, but higher than the refractive index of the p-type contact layer 710. The refractive index of cladding layer 725 is lower than the refractive index of the active region layer 720, but higher than the refractive index of the layers below.

Active region layer 720 in conjunction with the cladding layers and other layers of LED stack 700 operates as a dielectric waveguide to channel light towards an emitting edge located on external emitting surface 745 of LED stack 700. LED light is generated in the active region layer 720 when a suitable voltage is applied between p-type contact 705 and n-type contact 740.

External emitting surface 745 has an anti-reflective coating, while the external surface opposing external emitting surface 745 has a reflective coating. The reflective coating operates to reflect light generated in active region layer 720 towards external emitting surface 745. Consequently, light is inhibited from escaping out the external surface opposing external emitting surface 745.

Figure 8:
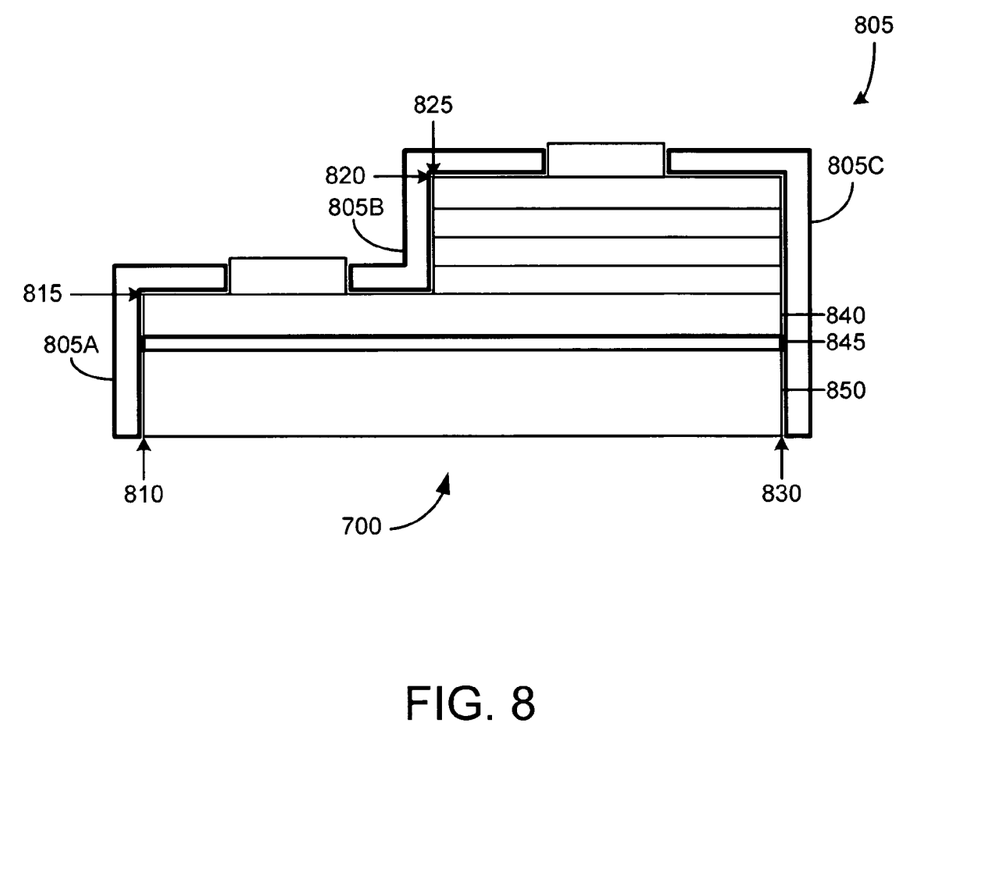
FIG. 8 shows the LED stack of FIG. 7 enclosed in a first exemplary reflective enclosure in accordance with the invention.

FIG. 8 shows LED stack 700 enclosed in a first exemplary reflective enclosure 805 in accordance with the invention. In this exemplary embodiment, reflective enclosure 805 is formed of three sections—reflective section 805A, reflective section 805B, and reflective section 805C. Reflective section 805A is located adjacent to external surface 810 and a first portion of external surface 815. Reflective section 805B is located adjacent to external surface 825, a first portion of external surface 820, and a second portion of external surface 815. Reflective section 805C is located adjacent to external surface 830 and a second portion of external surface 820.

In a first exemplary embodiment, each of the reflective sections 805A, 805B, and 805C are attached to the respective sides of LED stack 700 using an adhesive such as an optical quality epoxy. In a second exemplary embodiment, each of the reflective sections 805A, 805B, and 805C are attached to LED stack 700 using mechanical fasteners. In a third exemplary embodiment, each of the reflective sections 805A, 805B, and 805C are placed in contact with LED stack 700, and LED stack 700 is encapsulated together with the three reflective sections using a suitable material such as plastic or epoxy.

Furthermore, in the embodiment shown in FIG. 8, a reflective buffer layer 845 is located above substrate 850. In addition to operating as a buffer layer between substrate 850 and n-type contact layer 840, reflective buffer layer 845 is composed of material having a refractive index that is lower than the refractive index of the material of n-type contact layer 730. The refractive index of reflective buffer layer 840 is selected to provide a large degree of reflection to light transmitted from the active region.

Reflective sections 805A, 805B, and 805C in conjunction with reflective buffer layer 845 operate to reflect light emitted from the active region layer and other layers of LED stack 700 back towards the interior of LED stack 700. The reflected light is transmitted together with directly radiated light out of the external emitting edge of LED stack 700.

Figure 9:
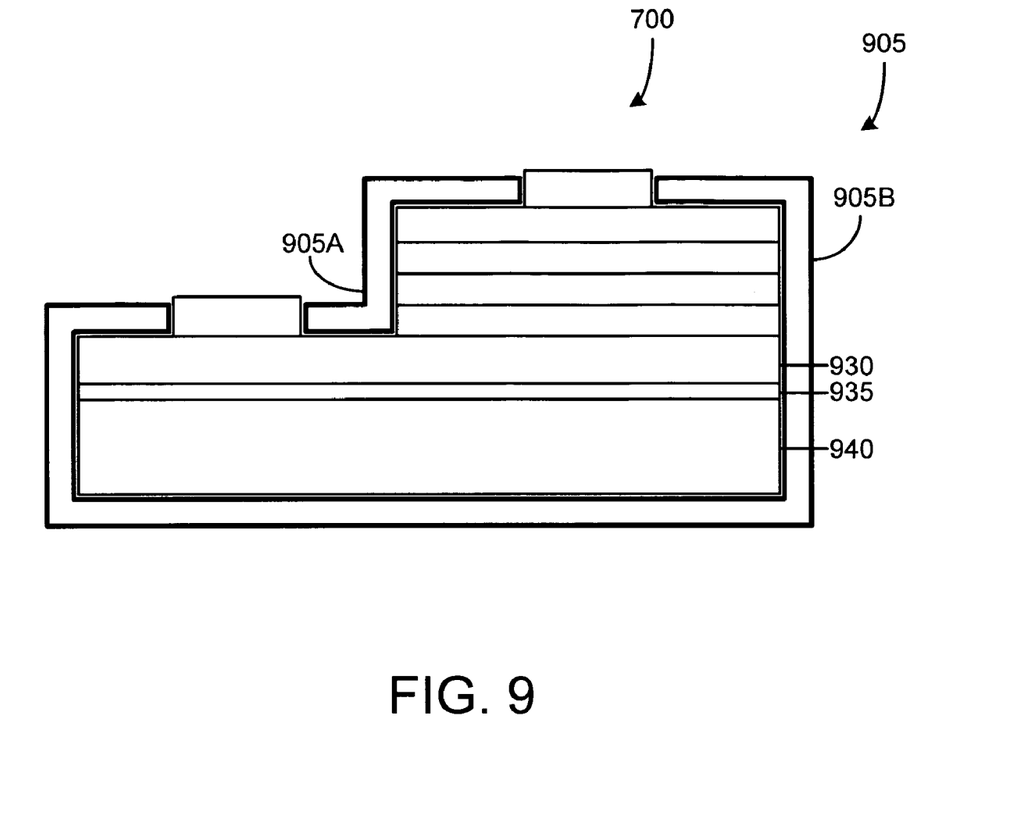
FIG. 9 shows the LED stack of FIG. 7 enclosed in a second exemplary reflective enclosure in accordance with the invention.

FIG. 9 shows LED stack 700 enclosed in a second exemplary reflective enclosure 905 in accordance with the invention. In this exemplary embodiment, reflective enclosure 905 is formed of two sections—reflective section 905A and reflective section 905B. Reflective section 905B encloses the two external side surfaces, a portion of the two external top surfaces, and the entire external bottom surface. In this exemplary embodiment, buffer layer 935 operates primarily as a buffer between substrate 940 and n-type contact layer 930.

Figure 10:
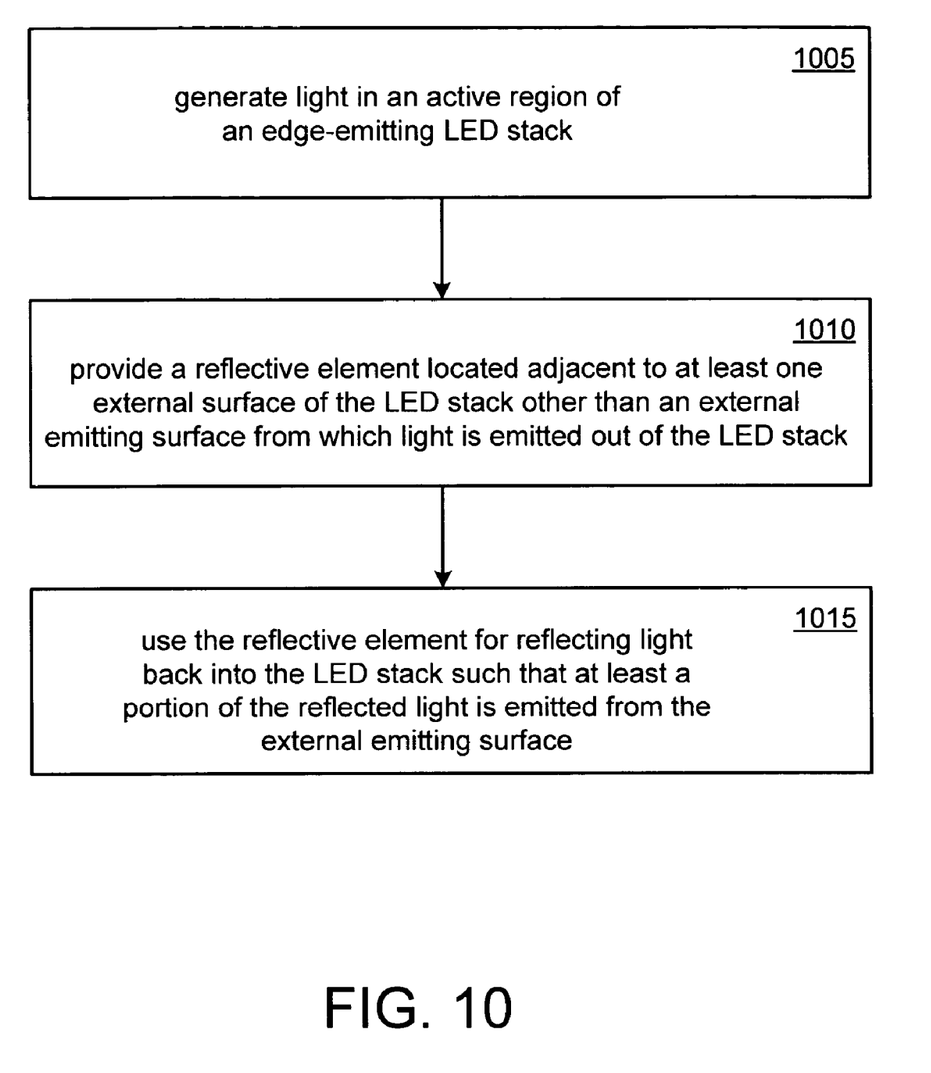
FIG. 10 is a flowchart of an exemplary method of light emission in accordance with the invention.

FIG. 10 is a flowchart of an exemplary method of light emission in accordance with the invention. In block 1005, incoherent light is generated in an active region of an edge-emitting LED. This is carried out by applying a suitable voltage between the n-type and p-type contacts of the edge-emitting LED. The incoherent light is propagated by waveguide action in an active region layer and is emitted from the external emitting surface. For purposes of description, this emitted light is referred to as waveguide light.

In block 1010, a first reflective element is provided. The first reflective element is located adjacent to at least one external surface of the LED stack other than the external emitting surface from which light is emitted from the LED stack. In block 1015, the reflective element is used to reflect light generated in the active region back into the LED stack such that at least a portion of the reflected light is emitted from the external emitting surface. This portion of reflected light is emitted together with the waveguide light, thereby leading to an increase in the intensity of light emitted out of the edge-emitting LED. Consequently, the efficiency of the edge-emitting LED is increased.

The above-described embodiments are merely set forth for a clear understanding of the principles of the disclosure. Many variations and modifications may be made without departing substantially from the disclosure. All such modifications and variations are included herein within the scope of this disclosure.

We claim:

1. A light emitting diode (LED) assembly comprising:
   an edge-emitting LED stack comprising:
      a first external emitting surface, the first external emitting surface configured to be non-reflective, thereby accommodating transmission of incoherent light out of the edge-emitting LED stack without reflecting light back into the edge-emitting LED stack;
      a second external surface comprising a p-type contact;
      a third external surface comprising an n-type contact;
      a fourth external surface opposing the first external emitting surface; and
      a reflective element located adjacent to at least one external surface of the LED stack, the at least one external surface excluding the first external emitting surface and the fourth external surface, the reflective element configured to reflect incoherent light that is generated in an active region of the LED stack back into the LED stack, wherefrom at least a portion of the reflected light is emitted out of the first external emitting surface along with incoherent light emitted directly from the active region of the edge-emitting LED stack.

2. The LED assembly of claim 1, wherein the second external surface of the LED stack is an external surface of a p-type contact layer and the at least one external surface is at least a portion of the external surface of the p-type contact layer.

3. The LED assembly of claim 1, wherein the third external surface of the LED stack is an external surface of an n-type contact layer and the at least one external surface is at least a portion of the external surface of the n-type contact layer.

4. The LED assembly of claim 1, wherein the LED stack further comprises a second reflective element located adjacent to an internal major surface of a substrate.

5. The LED assembly of claim 1, wherein the reflective element is a low-loss mirror having a thickness equal to a quarter-wave length of an emitted wavelength of light from the LED stack.

6. The LED assembly of claim 5 wherein the emitted wavelength of light is a mean wavelength in an emission spectrum of the LED stack.

7. The LED assembly of claim 1, wherein the reflective element comprises:
    a first reflective element having a thickness equal to a quarter-wave length of a first emitted wavelength of light from the LED stack; and
    a second reflective element having a thickness equal to a quarter-wave length of a second emitted wavelength of light from the LED stack.

8. The LED assembly of claim 7, wherein the first emitted wavelength of light and the second emitted wavelength of light are contained in an emission spectrum of the LED stack.

9. The LED assembly of claim 1, wherein the reflective element is a multilayer reflective element, and wherein the thickness of each of the multiple layers is identical.

10. The LED assembly of claim 1, wherein the reflective element is a multilayer reflective element, and wherein the thickness of each of the multiple layers decreases with location farther away from the at least one external surface.

11. The LED assembly of claim 1, wherein the reflective element is a multilayer reflective element, and wherein the thickness of each of the multiple layers bears a non-linear relationship with reference to other layers of the multilayer reflective element.

12. A method of light emission, the method comprising:
    generating incoherent light in an active region of an edge-emitting light emitting diode (LED) stack, the LED stack comprising a first external emitting surface; and
    using a first reflective element located adjacent to at least one external surface other than a) the first external emitting surface of the LED stack and b) an opposing external surface opposed to the first emitting surface, for reflecting the generated incoherent light back into the LED stack, wherefrom at least a portion of the reflected light is emitted out of the first external emitting surface along with incoherent light emitted directly from the active region of the LED stack.

13. The method of light emission of claim 12, further comprising:
    providing a second reflective element located adjacent to at least another external surface of the LED stack.

14. The method of light emission of claim 12, wherein the at least one external surface of the LED stack is at least a portion of an external surface of a p-type contact layer.

15. The method of light emission of claim 12, further comprising:
    providing a second reflective element located adjacent to an internal major surface of a substrate of the LED stack.

* * * * *